US011277889B2

(12) United States Patent
Pacheco

(10) Patent No.: US 11,277,889 B2
(45) Date of Patent: Mar. 15, 2022

(54) ADAPTIVE PREHEATING AND FILAMENT CURRENT CONTROL FOR MAGNETRON POWER SUPPLY

(71) Applicant: Koninklijke Fabriek Inventum B.V., Nieuwegein (NL)

(72) Inventor: Jorge Pacheco, Culemborg (NL)

(73) Assignee: Koninkiijke Fabriek Inventum B.V., Nieuwegein (NL)

( * ) Notice: Subject to any disclaimer, the term of this patent is extended or adjusted under 35 U.S.C. 154(b) by 441 days.

(21) Appl. No.: 16/289,952

(22) Filed: Mar. 1, 2019

(65) Prior Publication Data

US 2019/0281669 A1 Sep. 12, 2019

Related U.S. Application Data

(60) Provisional application No. 62/641,115, filed on Mar. 9, 2018, provisional application No. 62/641,127, filed on Mar. 9, 2018.

(51) Int. Cl.
*H05B 6/64* (2006.01)
*H05B 6/68* (2006.01)
*H05K 7/20* (2006.01)

(52) U.S. Cl.
CPC ............. *H05B 6/645* (2013.01); *H05B 6/681* (2013.01); *H05B 6/687* (2013.01); *H05K 7/2039* (2013.01)

(58) Field of Classification Search
CPC .. H05B 2206/043; H05B 6/645; H05B 6/666; H05B 6/681; H05B 6/687; H05K 7/2039
USPC ................ 219/721, 715, 718, 760, 761, 746
See application file for complete search history.

(56) References Cited

U.S. PATENT DOCUMENTS 5,049,782 A * 9/1991 Aiga ........................ H01J 23/05 315/39.51
5,325,266 A * 6/1994 Lim ...................... H01J 23/005 165/179
5,676,873 A * 10/1997 Takase .................... H01J 3/022 219/715

FOREIGN PATENT DOCUMENTS

JP 2005241128 A * 9/2005

OTHER PUBLICATIONS

Translation of JP2005241128A, Microwave oven for business use, Sep. 8, 2005, ProQuest. (Year: 2005).*

* cited by examiner

*Primary Examiner* — Quang T Van
(74) *Attorney, Agent, or Firm* — Suiter Swantz pc llo

(57) ABSTRACT

A system for adaptive preheating of a magnetron within a microwave oven is disclosed. In embodiments, the system includes temperature sensors for sensing a magnetron temperature. The system includes a power supply controller in communication with the microwave's power supply and the temperature sensors and including control processors. The power supply controller receives a requested power setting associated with a cooking cycle, e.g., selected by a user via a human-machine interface of the microwave oven. Before the cooking cycle commences, the power supply controller calculates a preheat time based on the sensed magnetron temperature. After starting a timer corresponding to the determined preheat time, the power supply controller preheats the filament by applying sufficient current to render the filament incandescent and so the resonant cavities may be stimulated. By preheating the filament, the system reduces operational fatigue on the filament due to cold starts.

17 Claims, 2 Drawing Sheets

100
GAIN 132
106
HMI 106
DISP 110
OCU 112
114a
PSU 114
PSU 114
122
118b
128
118a
124
120
126
130
102
116
104

ADAPTIVE PREHEATING AND FILAMENT CURRENT CONTROL FOR MAGNETRON POWER SUPPLY

CROSS-REFERENCE TO RELATED APPLICATIONS

The instant application claims priority under 35 U.S.C. § 119(e) to the following provisional U.S. Patent Application Ser. No. 62/641,115, filed Mar. 9, 2018; and Ser. No. 62/641,127, filed Mar. 9, 2018. Said provisional U.S. Patent Applications 62/641,115 and 62/641,127 are herein incorporated by reference in their entirety.

BACKGROUND

Microwave ovens heat consumables (e.g., food and beverages) placed therewithin by generating microwave energy via a magnetron (e.g., magnetron tube). By supplying a high voltage electrical field between a cathode (e.g., an internal filament) and surrounding anode vanes while supplying a high current to the internal filament (e.g., to generate a spinning electron cloud), the resonant cavities between the cathode and anode vanes may be stimulated to produce radio frequency (RF) energy of the desired high frequency (e.g., 2.45 GHz). The constant application of peak current to the filament, e.g., to a "cold" filament at startup or when switching between on/off cycles, may result in considerable operational fatigue upon the filament, which shortens its operating lifetime.

SUMMARY

A system for adaptive preheating of a magnetron within a microwave oven is disclosed. In embodiments, the system includes thermocouples or other temperature sensors for sensing a temperature of the magnetron. The system includes a power supply controller in communication with the microwave's power supply and the temperature sensors and including control processors. The power supply controller receives a requested power setting associated with a cooking cycle, e.g., selected by a user via a human-machine interface of the microwave oven. Before the cooking cycle commences, the power supply controller calculates a preheat time based on the sensed magnetron temperature. After starting a timer corresponding to the determined preheat time, the power supply controller preheats the filament by applying sufficient current to render the filament incandescent and so the resonant cavities may be stimulated.

In embodiments the magnetron temperature includes a core temperature proximate to the internal filament of the magnetron or a frame temperature proximate to the outer frame or cooling fins of the magnetron.

In embodiments, the preheat time is determined based on the lower of the core temperature and the frame temperature.

In embodiments, the power supply controller bounds the preheat time by a predetermined minimum preheat time and a predetermined maximum preheat time.

In embodiments, the preheat time is determined while the microwave oven is in a standby state prior to execution of a selected cooking cycle.

In embodiments, the requested power setting is below a preconfigured duty cycle threshold, and the power supply controller forces the power setting to the duty cycle threshold while calculating a duty cycle ratio of on-time to off-time; throughout each duty cycle of the cooking cycle, the power supply controller directs the power supply to provide a high voltage (HV) direct current to the magnetron during the on-time and, during the off-time, provide a preheat current to the internal filament during a short-preheat time window.

In embodiments, the power supply controller bounds the duty cycle ratio by a preconfigured minimum ratio and a preconfigured maximum ratio.

In embodiments, the power supply controller determines the duty cycle ration based on a ratio or proportion of the requested power setting to the duty cycle threshold.

In embodiments, the power supply controller is configured to monitor a rate of increase of the magnetron temperature over time.

In some embodiments, the power supply controller generates an empty cavity alert if the rate of increase exceeds a threshold, e.g., a degrees-per-second threshold.

In embodiments, the power supply controller generates the empty cavity alert if an average rate of increase exceeds a threshold over a sequence of consecutive time periods, e.g., a degrees-per-second threshold for a preconfigured number of consecutive seconds.

In embodiments, the power supply controller regulates the preheat current at a regular interval throughout the preheat time.

A system for filament current control of a magnetron within a microwave oven is also disclosed. In embodiments, the system includes thermocouples or other temperature sensors for sensing a temperature of the magnetron. The magnetron includes an internal filament, resonant cavities, and exterior cooling fins. The system includes a power supply connected to the magnetron, the power supply capable of generating an electromagnetic (EM) field between the filament and the resonant cavities by providing a high voltage (HV) direct current to the magnetron. The system includes a power supply controller in communication with the power supply and the temperature sensors, and including control processors. The power supply controller receives a requested power setting associated with a cooking cycle, e.g., selected by a user via a human-machine interface of the microwave oven. Before the cooking cycle commences, the power supply controller calculates a filament current setpoint based on the sensed magnetron temperature. Throughout the cooking cycle, the power supply controller applies to the internal filament a filament current corresponding to the calculated filament current setpoint.

In embodiments, at regular intervals during the cooking cycle, the power supply controller receives a sensed magnetron temperature from the temperature sensors. Based on the received sensed temperature, the power supply controller calculates a filament current offset and corrects the filament current based on the calculated filament current offset.

In embodiments, the system includes a memory or other similar data storage for storing an index of preconfigured current settings, each current setting mapped to a power setting.

In embodiments, the power supply controller sets the filament current setpoint to a preconfigured current setting when the requested power setting is equivalent to a preconfigured power setting mapped to the preconfigured current setting.

In embodiments, the power supply controller interpolates the filament current setpoint between two preconfigured current settings when the requested power setting is between two preconfigured power settings respectively corresponding to the two preconfigured current settings.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1:
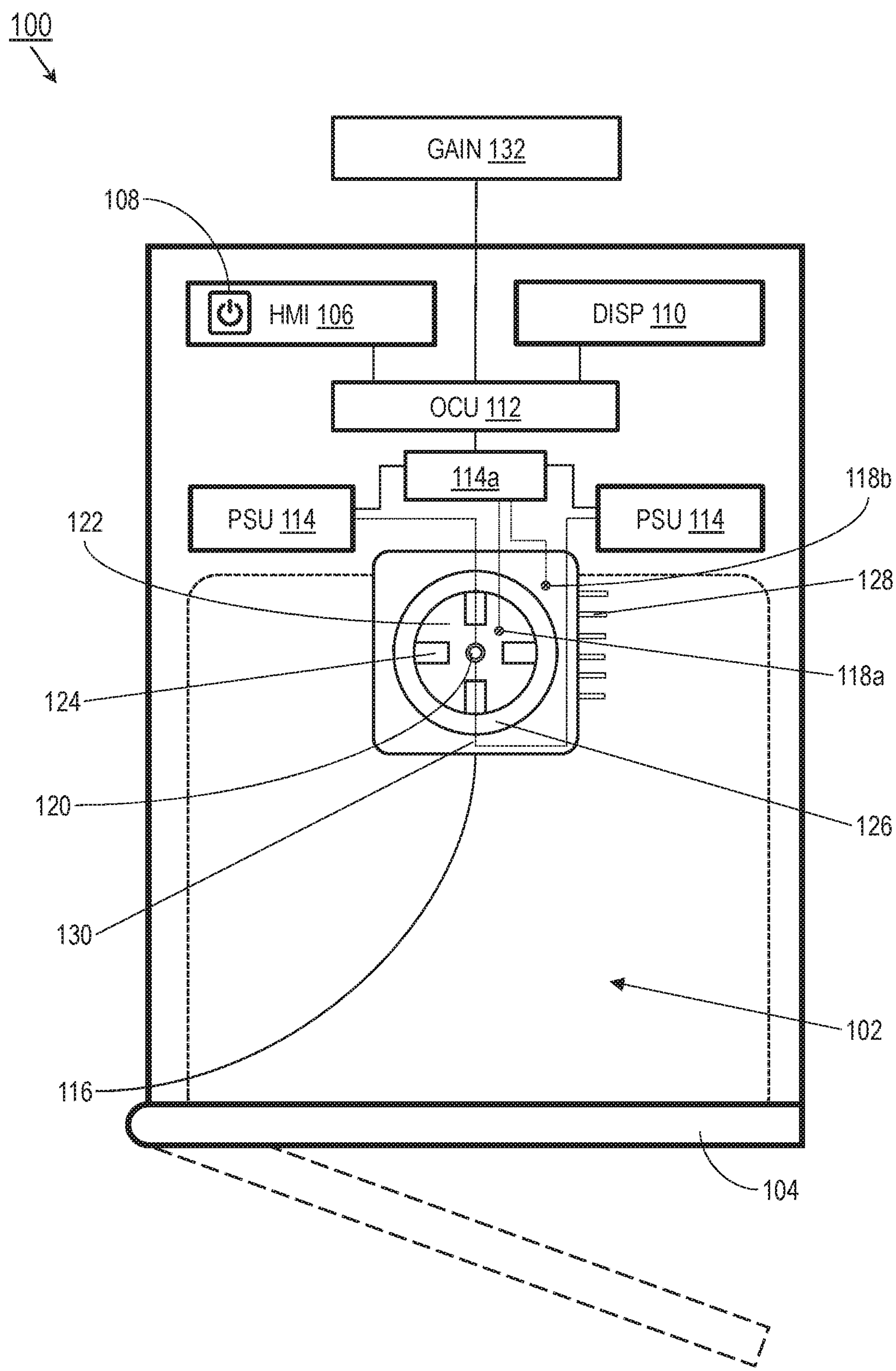
FIG. 1 is a block diagram illustrating a microwave oven in accordance with example embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1*a*, 1*b*). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

An adaptive preheating system for a magnetron supplying power to a microwave oven is disclosed. Broadly speaking, the system reduces operational fatigue and long-term wear on the internal filament of the magnetron/s by preheating the filament to an incandescent state when a cooking cycle is selected, prior to initiation of the cooking cycle and generation of high voltage (HV) direct current to the magnetron. A filament current control system for the magnetron is also disclosed. During a cooking cycle, the current supplied to the filament is regulated based on the sensed magnetron temperature to sustain microwave generation at a minimal but adequate power output level without causing undue strain on the filament.

Referring to FIG. 1, a microwave oven 100 is shown. In embodiments, the microwave oven 100 may include an interior cavity 102 accessible via a door 104, a human/machine interface 106 (HMI) including a power button 108, an external display 110, an oven control unit 112 (OCU), power supply units 114 (PSU) managed by a PSU controller 114*a*, a magnetron 116, and temperature sensors 118*a-b* (e.g., thermocouples). The magnetron 116 may have at its core an internal filament 120 within, and proximate to, resonant cavities 122 defined by spaced anode vanes 124 in an outer frame 126, as well as external cooling fins 128 which extend into the oven cavity 102. For example, the microwave oven 100 may comprise more than one magnetron 116, e.g., an upper and lower magnetron respectively proximate to the upper and lower inner surfaces of the oven cavity 102.

For example, the microwave oven 100 may heat food placed within the interior cavity 102 by supplying, via the PSUs 114, an alternating current to the internal filament 120 via cathode leads 130 (rendering the internal filament incandescent) while a magnetic field is generated parallel to the filament. The PSUs 114 may simultaneously supply high voltage (HV; e.g., 4 kV) direct current offset power to create an electromagnetic field between the internal filament 120 and the resonant cavities 122, generating microwave radiation and heating the contents of the oven cavity 102. The filament current (e.g., the alternating current) may be superimposed on the HV direct current signal.

The OCU 112 may further connect the microwave oven 100 to a galley insert (GAIN) controller 132, whereby the microwave oven may be connected to a galley-based or aircraft-based power supply (e.g., 115 VAC, 400 Hz). Similarly, the OCU 112 may supply the GAIN controller 132 with usage, performance, or status data at intervals or by request. The GAIN controller 132 may be responsible for distributing available power to the microwave oven 100 and other GAIN devices aboard the aircraft, based on a power budget request submitted by the microwave oven.

Figure 2:
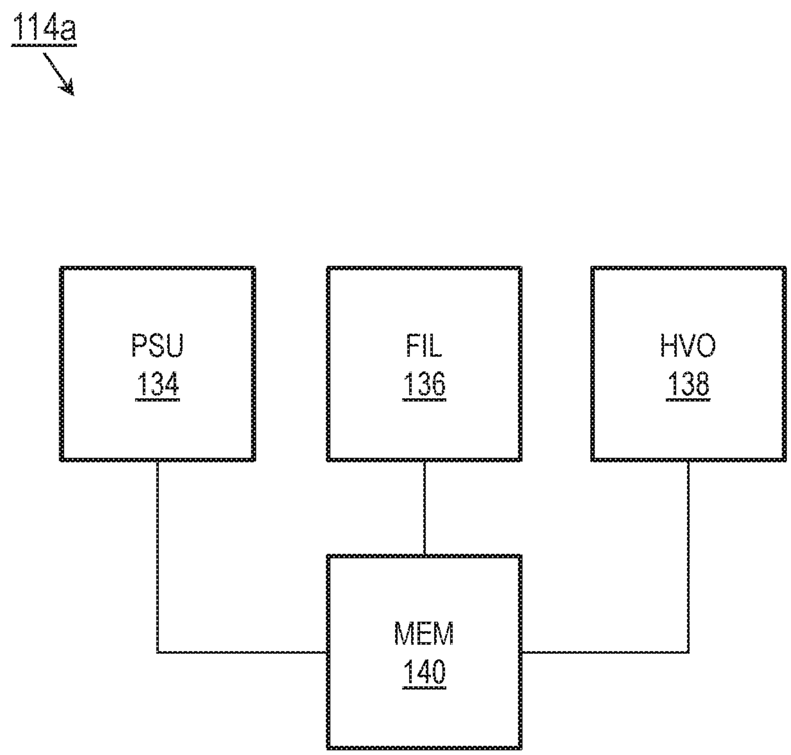
FIG. 2 is a block diagram illustrating components of a power supply controller of the microwave oven of FIG. 1.

Referring also to FIG. 2, the PSU controller 114*a* may include a power supply control module 134 (PSU), a filament control module 136 (FIL), a high voltage power control module (HVO), and a memory 140 or similar data storage capacity for storing configuration data.

When first connected to a power supply, the microwave oven 100 may perform a power-up self test (PUST) comprising several self-tests (e.g., test the cavity light within the internal cavity 102; test the buttons, lights, and components of the HMI 106; test the external display 110) and enter a "standby-off" state if no system or component errors are detected. If, for example, a user presses the power button 108 while in the "standby-off" state, the microwave oven 100 may perform a power-on self-test (POST) substantially similar to the PUST. If no system or component errors are found, the microwave oven may then enter a "standby-on" state. The current to the filament, as well as the high voltage (HV) power to the magnetron 116, may remain at zero.

With the microwave oven 100 in the "standby-on" state, the user may initiate a cooking cycle. For example, the user may, via the HMI 106, select a pre-programmed cooking cycle for execution or select a power level and cooking duration. Before activating the magnetron/s 116, the PSU controller 114*a* may initiate a preheating sequence, preheating the internal filament 120 into a "pre-glow" incandescent state to reduce the strain associated with otherwise directly introducing to the "cold" internal filament the peak current associated with generation of microwave energy.

For example, the PSU module 134 may determine a preheating time and start the internal filament 120 to commence the preheating sequence, during which a preheat current is applied to the internal filament. The preheat current may be fixed to a predetermined current setting, e.g., 13 A. The PSU module 134 may control and adjust the filament preheat time based on a temperature of the magnetron/s 116 as sensed by the temperature sensors 118*a-b*. For example, the filament preheat time may be configured for a minimum and a maximum, e.g., 8 seconds and 15 seconds respectively. The PSU module 134 may determine a setpoint for the preheat time based on the requested power setting. The preheat time setpoint may be tuned based on a core temperature (e.g., of the magnetron 116 at its core, proximate to the internal filament 120) or a frame temperature (e.g., heatsink temperature; proximate to the outer frame 126 or the cooling fins 128) generally lower than the core temperature (e.g., 30-40 C below).

For example, the minimum and maximum preheat times, minPreheatTime and maxPreheatTime, may be set at 8 and 15 seconds (8,000 msec and 15,000 msec) respectively, and the initial preheat time set at:

$$time_{msec} = \frac{((-\text{power}))*100}{12} + maxPreheatTime_{msec}$$

(e.g., for a requested power of 1000 W and a maxPreheatTime of 15 seconds (15,000 msec), 6,666.67 msec or ~6.667 seconds).

If the lower of the core temperature and the frame temperature is greater than or equal to 10 C, any preheat time below the minimum will be set to minPreheatTime and any time above the maximum may be set to maxPreheatTime (e.g., for a temperature of 15 C, ~6.667 seconds may be set to the minimum preheat time of 8 seconds).

If the lower of the core temperature and the frame temperature is 0 C or greater but less than 10 C, the preheat time may be incremented (in msec):

$$\text{time}_{msec}\text{+=}200*(10-\text{temperature})$$

(e.g., if the temperature is 0 C, the preheat time of ~6.667 seconds may be incremented by 2000 msec (2 seconds), resulting in a modified preheat time of ~8.667 seconds).

If the lower of the core temperature and the frame temperature is less than 0 C, the preheat time may be incremented (in msec):

$$\text{time}_{msec}\text{+=}(200*(-\text{temperature}))+2000$$

(e.g., if the temperature is −25 C, the preheat time of ~6.667 seconds may be incremented by (200*25)+2,000=7,000 msec (7 seconds), resulting in a modified preheat time of ~13.667 seconds).

At regular intervals during the preheating sequence (e.g., every 500 msec), the FIL module 136 may regulate the preheat current (e.g., via 200 mA hysteresis cycle).

In some embodiments, the preheating sequence may be modified for use during a cooking cycle if, for example, the requested power setting is below a predetermined duty cycle threshold (e.g., 500 W) and the HV direct current is switched on/off via dutycycling throughout the duration of the cooking cycle. The PSU module 134 may set the requested power setting to the duty cycle threshold and (e.g., based on the ratio of the requested power to the duty cycle threshold) determine a duty cycle ratio of on-time ($T_{on}$) to off-time ($T_{off}$). For example, if the requested power setting is 200 W, the duty cycle ratio may be set at 40%, e.g., 40% on-time and 60% off-time. During the on-time of each duty cycle, the HVO module 138 may supply the HV direct current to the magnetron 116 as would occur during a normal-power cooking cycle. During the off-time of each duty cycle the HV direct current is switched off, but a short preheat time occurs (e.g., 3 seconds) during which the internal filament 120 is preheated prior to the next on-time by applying the preheat current (e.g., 13 A).

In some embodiments, the duty cycle ratio may be bounded by predetermined minimum and maximum ratios. For example, the microwave oven 100 may be configured for a maximum duty cycle of (100-P) percent, where P is a percentage ratio of the short-preheat time (e.g., 3 seconds) to a preconfigured duty cycle time (e.g., 10 seconds; therefore P=30% and the maximum duty cycle=70%). Similarly, the microwave oven 100 may be configured for a minimum duty cycle (e.g., 10%). If a calculated duty cycle exceeds the maximum duty cycle, the PSU module 134 may increment the requested power setting such that the desired output power may be achieved via the maximum duty cycle.

The duty cycle on-time ($T_{on}$) and off-time ($T_{off}$) may also be calculated:

$$T_{on} = \frac{(\text{duty} * dutyCycleTime)}{100} \text{ and}$$

$$T_{off} = \frac{((100 - \text{duty}) * dutyCycleTime)}{100} - preheatTimeShort$$

where duty is the calculated duty cycle ratio (e.g., a duty of 40 implies a duty cycle ratio of 40%), dutyCycleTime the preconfigured duty cycle time, and preheatTimeShort the short-preheat time (during which, however, the HV direct current is switched off).

The microwave oven 100 may sustain damage if a cooking cycle executes while the oven cavity 102 is empty. For example, if no consumables are present to absorb the generated microwave radiation, the radiation may be reflected back into the magnetron 116. In some embodiments, the PSU module 134 may monitor the temperature of the magnetron 116 to prevent operation of the microwave oven 100 with an empty oven cavity 102. For example, if the temperature sensors 118*a-b* indicate that the temperature of the magnetron (e.g., either the core temperature or frame temperature) is increasing at a high enough rate per second, e.g., above a preconfigured threshold (10 C or higher per second), the PSU module 134 may generate an empty cavity alert (e.g., causing the OSU 112 to impose a resettable error state on the microwave oven 110 and indicate the error state (and/or prompt user intervention) via the HMI 106). Alternatively, the PSU module 134 may generate an empty cavity alert based on an average rise in magnetron temperature over a preconfigured sequence of time periods. For example, if the core temperature or frame temperature of the magnetron 116 increases more than 4 C per second for a period of 3 seconds, an empty cavity alert may be generated.

In some embodiments, when a preheating sequence is complete, the PSU module 134 may monitor and manage the filament current throughout a cooking cycle based on the requested power setting for the cooking cycle or on the sensed temperature of the magnetron 116.

In some embodiments, the PSU module 134 may determine a setpoint for the filament current based on the starting power of the magnetron 116 (e.g., 1300 W) or on the requested power setting for the current cooking cycle. For example, the memory 140 may store predetermined mappings of requested power settings to filament current settings. A requested power setting of 700 W may be mapped to a filament current of 6000 mA (6 A), and thus the FIL module 136 may determine a basic setpoint of 6 A for the filament current. If the requested power setting does not map to an explicit filament current setting stored to memory 140, the FIL module 136 may respond by interpolating a filament current setpoint between two explicit mappings. For example, for a requested power setting of 800 W, the FIL module 136 may reference filament current settings of 5 A (::900 W) and 6 A (::700 W) respectively and interpolate between the two, e.g., determining a filament current setpoint of 5.5 A (or otherwise between 5 A and 6 A). The memory 140 may store a preconfigured maximum filament current (e.g., 9.5 A) to which the filament current may be bounded.

At regular intervals during the cooking cycle (e.g., every 500 msec), the FIL module 136 may regulate the filament current (e.g., via 200 mA hysteresis cycle) and correct the filament current by calculating a current offset based on a temperature of the magnetron 116 as sensed by the temperature sensors 118*a-b*. For example, if the lower of the core temperature and the frame temperature is less than 5 C but not less than −10 C, the FIL module 136 may determine a current offset of 2 A (2000 mA). If, however, the lower of the core temperature and the frame temperature is less than −10 C, the FIL module 136 may determine a current offset:

filCurrentOffset=(60*(−temperature))+2000 mA (for example, at a temperature of −20 C, filCurrentOffset=(60*20)+2000 mA=3200 mA). The FIL module 136 may be configured for a maximum current offset (e.g., 4000 mA) such that any determined filament current offset above the maximum may be reduced to the maximum current offset.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

I claim:

1. A system for adaptive preheating of a magnetron, comprising:

one or more temperature sensors in communication with a magnetron and configured to sense a temperature of the magnetron, the magnetron associated with a microwave oven and having an internal filament and a plurality of cooling fins;

and a power supply controller coupled to a power supply of the microwave oven and to the temperature sensors, the power supply controller including at least one processor and configured to:

receive a requested power setting associated with a cooking cycle;

determine a preheat time based on the sensed temperature;

start a preheat timer corresponding to the preheat time; and direct the power supply to apply a preheat current to the internal filament during the preheat time.

2. The system of claim 1, wherein the sensed temperature includes at least one of:

a core temperature associated with a core of the magnetron;

and a frame temperature associated with at least one of an outer frame of the magnetron and the cooling fins.

3. The system of claim 2, wherein the power supply controller is configured to determine the preheat time based on the lower of the core temperature and the frame temperature.

4. The system of claim 1, wherein the preheat time is no less than a predetermined minimum preheat time and no more than a predetermined maximum preheat time.

5. The system of claim 1, wherein the microwave oven is in a standby state.

6. The system of claim 1, wherein the requested power setting is below a duty cycle threshold, and the power supply controller is configured to:

set the requested power setting to the duty cycle threshold;

calculate a duty cycle ratio of on-time to off-time;

and, during each duty cycle of the cooking cycle, 1) direct the power supply to provide a high voltage (HV) direct current to the magnetron during the on-time; and 2) direct the power supply to provide the preheat current during a short-preheat time within the off-time.

7. The system of claim 6, wherein the duty cycle ratio is between a predetermined minimum ratio and a predetermined maximum ratio.

8. The system of claim 6, wherein the duty cycle ratio is based on a ratio of the requested power setting to the duty cycle threshold.

9. The system of claim 1, wherein the power supply controller is configured to sense a rate of increase of the sensed temperature over time.

10. The system of claim 9, wherein the power supply controller is configured to generate an empty cavity alert based on the rate of increase exceeding a first threshold.

11. The system of claim 9, wherein the power supply controller is configured to generate an empty cavity alert based on an average of the rate of increase exceeding a second threshold over a sequence of consecutive time periods.

12. The system of claim 1, wherein the power supply controller is configured to regulate the preheat current at a predetermined interval during the preheat time.

13. A system for filament current control of a magnetron, comprising:

one or more temperature sensors in communication with a magnetron and configured to sense a temperature of the magnetron, the magnetron associated with a microwave oven and having an internal filament, a plurality of resonant cavities, and a plurality of cooling fins;

a power supply electronically coupled to the magnetron and configured to:

generate an electromagnetic (EM) field between the internal filament and the resonant cavities by providing a high voltage (HV) direct current to the magnetron;

and provide a filament current to the internal filament by superimposing an alternating current on the HV direct current; and a power supply controller coupled to the power supply and to the temperature sensors, the power supply controller including at least one processor and configured to:

receive a requested power setting associated with a cooking cycle;

determine a filament current setpoint based on the requested power setting;

and direct the power supply to apply the filament current corresponding to the filament current setpoint during the cooking cycle.

14. The system of claim 13, wherein the power supply controller is configured to, at a regular interval during the cooking cycle:

1) receive a sensed temperature from the temperature sensors;

2) calculate a current offset based on the received sensed temperature; and 3) correct the filament current based on the calculated current offset.

15. The system of claim 13, further comprising:

a memory coupled to the power supply controller, the memory configured to store a plurality of predetermined current settings, each predetermined current setting corresponding to a predetermined power setting.

16. The system of claim 15, wherein the power supply controller is configured to set the filament current setpoint to a first current setting when the requested power setting is equal to a first power setting corresponding to the first current setting.

17. The system of claim 15, wherein the power supply controller is configured to interpolate the filament current setpoint between a first current setting and a second current setting when the requested power setting is between a first predetermined power setting corresponding to the first current setting and a second predetermined power setting corresponding to the second current setting.

* * * * *